United States Patent
Baggett et al.

(10) Patent No.: US 10,679,818 B2
(45) Date of Patent: **\*Jun. 9, 2020**

(54) LOW CONDUCTANCE SELF-SHIELDING INSULATOR FOR ION IMPLANTATION SYSTEMS

(71) Applicant: Axcelis Technologies, Inc., Beverly, MA (US)

(72) Inventors: John F. Baggett, Amesbury, MA (US); Neil Colvin, Merrimack, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/100,645

(22) Filed: Aug. 10, 2018

(65) Prior Publication Data
US 2018/0350553 A1    Dec. 6, 2018

Related U.S. Application Data

(63) Continuation of application No. 15/350,832, filed on Nov. 14, 2016, now Pat. No. 10,074,508, which is a
(Continued)

(51) Int. Cl.
*H01J 37/08* (2006.01)
*H01J 37/317* (2006.01)

(52) U.S. Cl.
CPC .......... *H01J 37/08* (2013.01); *H01J 37/3171* (2013.01); *H01J 2237/022* (2013.01); *H01J 2237/0206* (2013.01); *H01J 2237/038* (2013.01)

(58) Field of Classification Search
CPC ................ H01J 37/08; H01J 37/3171; H01J 2237/0206; H01J 2237/022;
(Continued)

(56) References Cited

U.S. PATENT DOCUMENTS 3,338,768 A    11/1964 Kuhl
5,443,798 A    8/1995  Kerrebrock
(Continued)

FOREIGN PATENT DOCUMENTS

| | | |
|---|---|---|
| DE | 102005059754 A1 | 6/2007 |
| GB | 191516550 A | 9/1916 |
| JP | S6260873 A | 3/1987 |

OTHER PUBLICATIONS

International Search Report dated Feb. 6, 2017 in connection with International Application PCT/US2016/061331.
(Continued)

*Primary Examiner* — Nicole M Ippolito
(74) *Attorney, Agent, or Firm* — Eschweiler & Potashnik LLC

(57) ABSTRACT

An insulator for an ion source is positioned between the apertured ground electrode and apertured suppression electrode. The insulator has an elongate body having a first end and a second end, where one or more features are defined in the elongate body and increase a gas conductance path along a surface of the elongate body from the first end to the second end. One or more of the features is an undercut extending generally axially or at a non-zero angle from an axis of the elongate body into the elongate body. One of the features can be a rib extending from a radius of the elongate body.

20 Claims, 10 Drawing Sheets

Related U.S. Application Data continuation of application No. PCT/US2016/061331, filed on Nov. 10, 2016.

(60) Provisional application No. 62/253,399, filed on Nov. 10, 2015.

(58) Field of Classification Search
CPC .......... H01J 2237/038; H01J 1/88; H01J 1/90; H01J 3/38; H01J 19/42; H01J 19/44; H01J 29/82; H01J 49/068
USPC ............ 250/423 R, 424, 492.1, 492.2, 492.3
See application file for complete search history.

(56) References Cited

U.S. PATENT DOCUMENTS

| | | |
|---|---|---|
| 7,915,597 B2 | 3/2011 | Huang et al. |
| 9,006,690 B2 | 4/2015 | Colvin et al. |
| 10,074,508 B2 * | 9/2018 | Baggett .................. H01J 37/08 |
| 2003/0076452 A1 | 4/2003 | Kim et al. |
| 2011/0240889 A1 | 10/2011 | Colvin et al. |

OTHER PUBLICATIONS

Non Final Office Action dated Dec. 18, 2017 in connection with U.S. Appl. No. 15/350,832.

Notice of Allowance dated May 16, 2018 in connection with U.S. Appl. No. 15/350,832.

\* cited by examiner

US 10,679,818 B2

LOW CONDUCTANCE SELF-SHIELDING INSULATOR FOR ION IMPLANTATION SYSTEMS

REFERENCE TO RELATED APPLICATIONS

This application is a Continuation of U.S. patent application Ser. No. 15/350,832, filed on Nov. 14, 2016, which is a Continuation of International Patent Application number PCT/US16/61331, filed on Nov. 10, 2016, which claims priority to U.S. Provisional Application No. 62/253,399 filed Nov. 10, 2015, entitled "LOW CONDUCTANCE SELF-SHIELDING INSULATOR FOR ION IMPLANTATION SYSTEMS", the contents of which are herein incorporated by reference in their entirety.

FIELD

The present invention relates generally to ion implantation systems, and more specifically to an insulator having an increased service time for an extraction electrode.

BACKGROUND

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. Such beam treatment is often used to selectively implant the wafers with impurities of a specified dopant material, at a predetermined energy level, and in controlled concentration, to produce a semiconductor material during fabrication of an integrated circuit. When used for doping semiconductor wafers, the ion implantation system injects a selected ion species into the workpiece to produce the desired extrinsic material. Implanting ions generated from source materials such as antimony, arsenic, or phosphorus, for example, results in an "n-type" extrinsic material wafer, whereas a "p-type" extrinsic material wafer often results from ions generated with source materials such as boron, gallium, or indium.

A typical ion implanter includes an ion source, an ion extraction device, a mass analysis device, a beam transport device and a wafer processing device. The ion source generates ions of desired atomic or molecular dopant species. These ions are extracted from the source by an extraction system, typically a set of electrodes, which energize and direct the flow of ions from the source, forming an ion beam. Desired ions are separated from the ion beam in a mass analysis device, typically a magnetic dipole performing mass dispersion or separation of the extracted ion beam. The beam transport device, typically a vacuum system containing a series of focusing devices, transports the ion beam to the wafer processing device while maintaining desired properties of the ion beam. Finally, semiconductor wafers are transferred in to and out of the wafer processing device via a wafer handling system, which may include one or more robotic arms, for placing a wafer to be treated in front of the ion beam and removing treated wafers from the ion implanter.

SUMMARY

The present disclosure provides a system, apparatus, and method for increasing a lifetime of an electrical insulator, such as an insulator used in an ion beam implantation system. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

This present disclosure provides a design to increase lifetime of an insulator used in an ion implanter and or other semi-conductor processing equipment such as CVD, PVD, MOCVD, etching equipment, among others. During operation of the equipment, insulator components will typically be coated over time with a conductive material, thus causing the surface of the insulator to lose its insulating properties. Arcing can occur once the surface of the insulator surface is coated with the conductive material, thus necessitating replacement of the insulator. The insulator of the present disclosure contemplates its application in any semiconductor processing equipment where gases are cracked to liberate species, or when plating of insulators is problematic.

For example, when an insulator is used to electrically isolate components in an ion source or extraction electrode of an ion implanter, various conductive materials can readily adhere to the surface of the insulator, thereby reducing the functional lifetime of the insulator. For example, free atoms of carbon, tungsten, and molybdenum from sputtering/etching of the arc chamber or extraction electrodes, as well as desired metallic components of the ion beam, can readily adhere to the surface of the insulator, thus providing deleterious conductive pathways across the surface of the insulator, which consequently reduce the functional lifetime of the insulator.

Additionally, the extraction of fluorine (e.g., a common by product of cracking $GeF_4$, $BF_3$, $SiF_4$, $PF_3$, and other fluoride based dopant gases) can react with graphite extraction electrode apertures to form $CF_x$, which is highly corrosive conductive gas that will react with the insulator material and leave behind a conductive carbon coating. For example, Electron Spectroscopy for Chemical Analysis (ESCA) of the surface of an insulator with greater than 100 hours of sub-5 keV arsenic and boron (e.g., B-11) implantation indicates a high initial carbon surface content (e.g., 80% and 60% atomic carbon, respectively) after 20 seconds of ion sputtering. Other exemplary elements present in decreasing order can comprise fluorine, molybdenum, aluminum, tungsten and calcium.

The insulator disclosed in the present invention can be implemented in various regions of the ion beam line where desired metal ion being transported scatters (e.g., due to space charge or ion neutralization), or in regions where the ion beam strikes a surface, thus sputtering and coating nearby insulators with a conductive coating.

Accordingly, a self-shielding insulator is provided having shielding features defined by the geometry of the insulator to protect the surface of the insulator from being coated with conductive material. The shielding features of the geometry of the insulator can advantageously decrease conductance to the surface of the insulator and protect the insulator from material that would otherwise reduce its insulating effectiveness. Such shielding features can also advantageously increase a surface area of the insulator and further increase the tracking length of the insulator, which is the length required for a potential to travel across the insulator. Dimensions and geometry of such shielding is configured to not cause a failure due to arcing by not providing surfaces that are either too close to one another, while also maintaining its effectiveness as a shield by not spacing the surfaces too far from one another.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
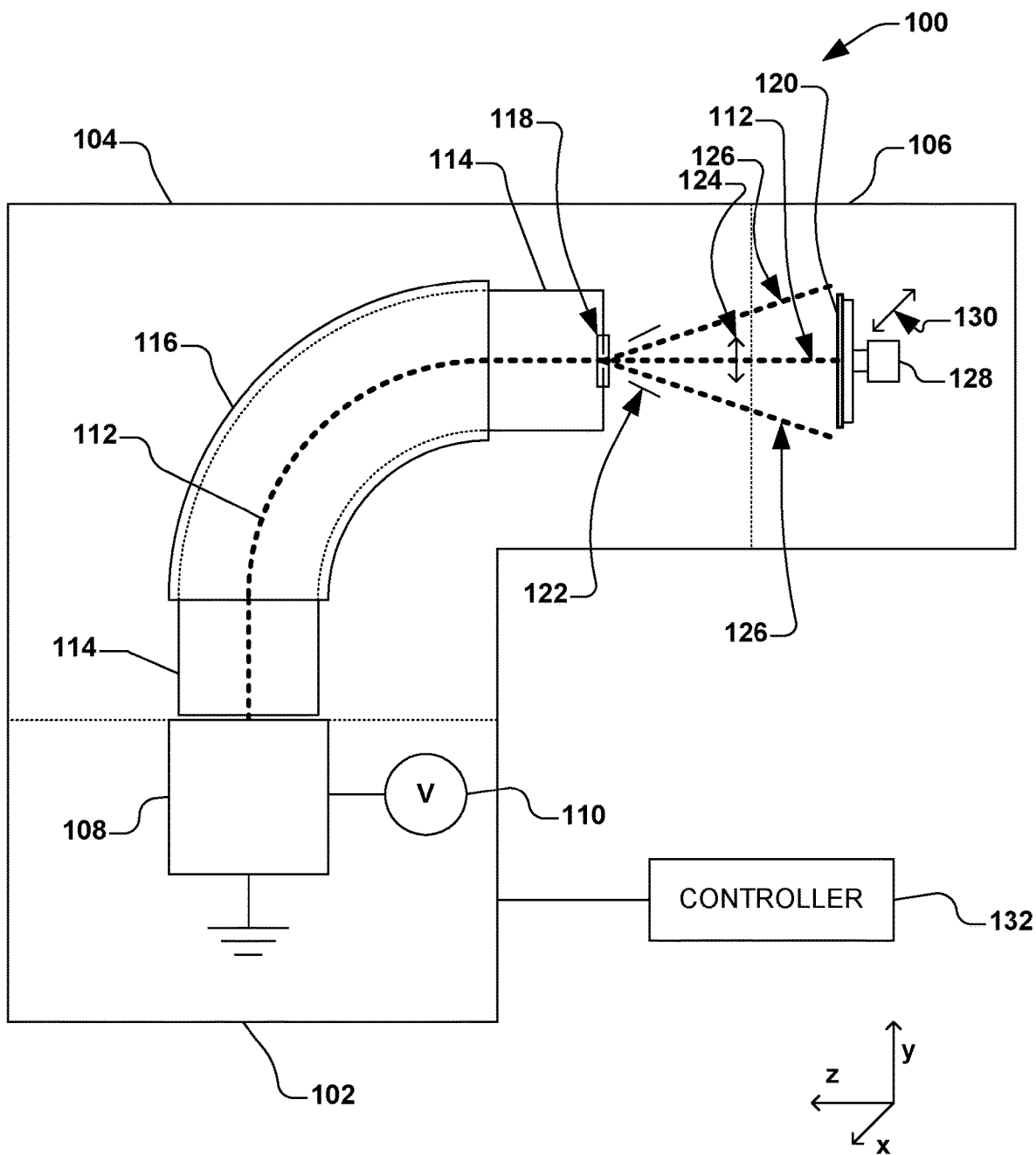
FIG. 1 is a block diagram of an exemplary ion implantation system in accordance with several aspects of the present disclosure.

The present invention is directed generally toward a system, apparatus, and method for manufacturing an electrical insulator for an ion implantation system. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the Figures, FIG. 1 illustrates an exemplary ion implantation system 100 is provided, wherein various aspects of the present disclosure may be implemented in the ion implantation system. In accordance with one example, the ion implantation system 100 has a terminal 102, a beamline assembly 104, and an end station 106. The terminal 102, for example, comprises an ion source 108 powered by a high voltage power supply 110, wherein the ion source produces and directs an ion beam 112 through the beamline assembly 104, and ultimately, to the end station 106. The ion beam 112, for example, can take the form of a spot beam, pencil beam, ribbon beam, or any other shaped beam. The beamline assembly 104 further has a beamguide 114 and a mass analyzer 116, wherein a dipole magnetic field is established to pass only ions of appropriate charge-to-mass ratio through an aperture 118 at an exit end of the beamguide 114 to a workpiece 120 (e.g., a semiconductor wafer, display panel, etc.) positioned in the end station 106.

In accordance with one example, an ion beam scanning mechanism 122, such as an electrostatic or electromagnetic scanner (referred to generically as a "scanner"), is configured to scan the ion beam 112 in at least a first direction 124 (e.g., the +/−y-direction, also called a first scan path or "fast scan" axis, path, or direction) with respect to the workpiece 120, therein defining a ribbon-shaped ion beam or scanned ion beam 126. Furthermore, in the present example, a workpiece scanning system 128 is provided, wherein the workpiece scanning system is configured to selectively scan the workpiece 120 through the ion beam 112 in at least a second direction 130 (e.g., the +/−x-direction, also called a second scan path or "slow scan" axis, path, or direction).

The ion beam scanning system 122 and the workpiece scanning system 128, for example, may be instituted separately, or in conjunction with one another, in order to provide the desired scanning of the workpiece relative to the ion beam 112. In another example, the ion beam 112 is electrostatically scanned in the first direction 124, therein producing the scanned ion beam 126, and the workpiece 120 is mechanically scanned in the second direction 130 through the scanned ion beam. Such a combination of electrostatic and mechanical scanning of the ion beam 112 and workpiece 120 produces what is called a "hybrid scan". The present invention is applicable to all combinations of scanning of the workpiece 120 relative to the ion beam 112, or vice versa. Further, a controller 132 is provided, wherein the controller is configured to control one or more components of the ion implantation system 100.

Figure 2:
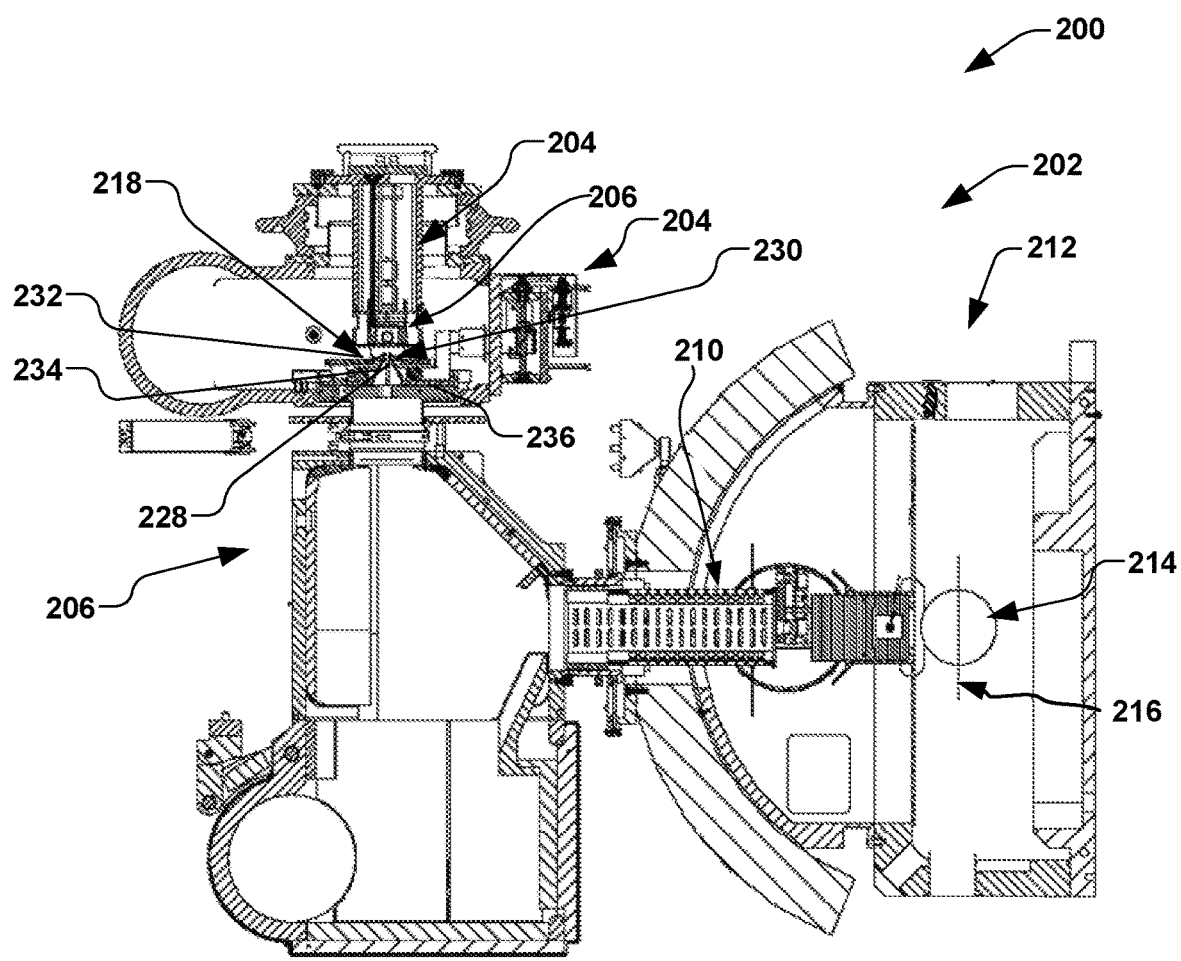
FIG. 2 is a cross-sectional plan view of an exemplary ion implantation system in accordance with several aspects of the present disclosure.

Another exemplary ion implantation system 200 is provided in FIG. 2, and various ion implantation systems are further provided in commonly-owned U.S. Pat. No. 7,915,597 to Huang et al., the contents of which are incorporated by reference, in their entireties, herein. The ion implantation system 200 of FIG. 1 illustrates an exemplary high-dose ion implantation system 202 that makes use of various features provided infra according to various aspects of the disclosure. It should be noted that various other configurations of the ion implantation systems 100, 200 for FIGS. 1 and 2 are also contemplated as falling within the scope of the present disclosure. The implantation system 200 comprises multiple subsystems, including an ion source 204 for producing an ion beam (not shown), a beamline assembly 206 including a mass analysis magnet for mass analyzing the ion beam, a beam tunnel accelerator/de-accelerator 210 and an end station 212 which contains a workpiece scanner 214 for reciprocating a workpiece 216 through the stationary ion beam, for example.

Figure 3:
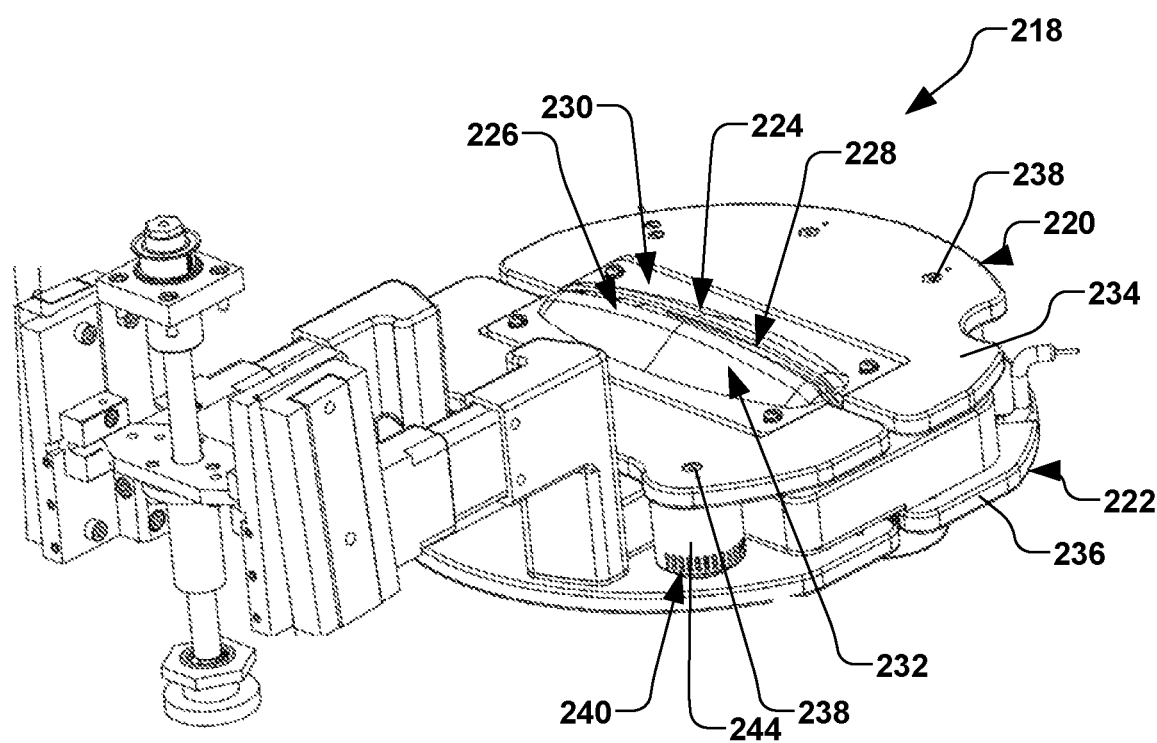
FIG. 3 is a perspective view of an exemplary extraction electrode apparatus having an insulator according to various aspects of the present disclosure.

An exemplary extraction electrode assembly 218 may be provided to extract ions from the ion source 204, where a particular example of the extraction electrode assembly is further provided in FIG. 3. The extraction electrode assembly 218, for example, is comprised of two matching graphite disk assemblies 220 and 224. The disk assemblies 220 and 222 are assembled and aligned in a shared plane that is perpendicular to a predetermined beam path and the assemblies are spaced apart to define an elongated gap 224 in which the ions exiting from the ion source 204 of FIG. 2 pass through. The extraction electrode assembly 218 of FIG. 3, for example, can be precisely aligned with the predetermined ion beam path.

Extraction electrodes 224, 226, such as shown in FIG. 3, for example, are generally used in conjunction with the ion source 204 of FIG. 2 to extract a beam of ions therefrom, wherein ions formed in the confinement chamber are extracted through an exit aperture 228 in a front face 230 of the ion source. The front face 228 of the ion source 204 forms an apertured source electrode 232 (sometimes referred to as an extraction electrode) at the potential of the ion source. The extraction electrodes 224, 226, for example, include an apertured suppression electrode 234 and an apertured ground electrode 236 aligned with the first apertured source electrode to allow the ion beam emerging from the ion source 204 to pass therethough. Each aperture, for example, has an elongated slot configuration.

The apertured suppression electrode 234 can be secured in a spaced apart relationship to the apertured ground electrode 236 using, for example, spring-loaded shoulder screws 238 in conjunction with ceramic spacers or insulators 240 in between disk assemblies 220 and 222 to provide a spaced apart, parallel relationship, as well as electrical insulation therebetween.

Figure 4:
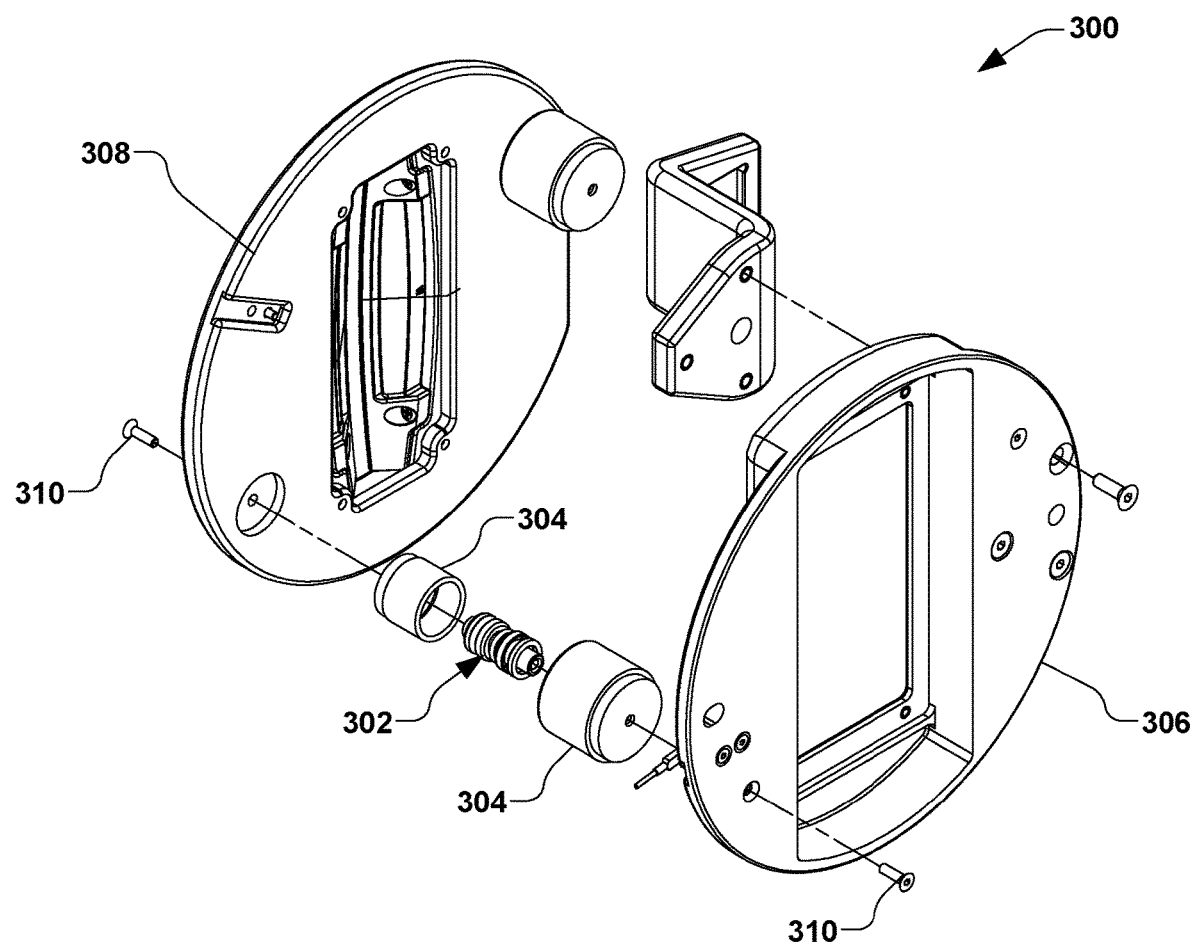
FIG. 4 is an exploded view of an exemplary extraction electrode apparatus having an insulator according to various aspects of the present disclosure.

FIG. 4 illustrates the extraction electrode assembly 218 in an exploded view, where ceramic insulators 242 are arranged or mounted between the suppression electrode 234 and ground electrode 236 for electrically isolating the suppression electrode and ground electrode. The ground electrode 236, for example, restricts the propagation of electric fields between the ground electrode and the ion source into the region downstream of the ground electrode. The suppression electrode 234, for example, is biased by a voltage supply to a negative potential relative to ground, and operates to prevent electrons in the ion beam downstream of the ground electrode 236 from being drawn into the extraction region and into the ion source.

The suppression electrode 234 and ground electrode 236 are mounted so as to be movable relative to the source 204 of FIG. 2 in the direction of travel of the ion beam so that the extraction electrodes can be "tuned" in accordance with the energy of the beam extracted from the ion source. The suppression electrode 234 and ground electrode 236 are further mounted such that the suppression and ground electrodes are relatively laterally movable approximately perpendicular to the ion beam direction, relative to the ion source 204. In addition, a mechanism may also be provided for varying the size of the aperture in the electrodes.

The energy of the ion beam emerging from the extraction electrode assembly 218 is determined by the voltage supplied to the ion source 204. A typical value for the voltage supplied to the ion source 204 is 20 kV, providing extracted beam energy of 20 keV. However, extracted beam energies of 80 keV and higher, or 0.5 keV or lower may also be obtained. To obtain higher or lower beam energies, the source voltage is respectively raised or lowered.

It has been found that voltage biases associated with the ion source 204 and extraction electrode assembly 218 of an ion implantation system 200, in combination with the ionized source gas present in that environment, can lead to the formation of deposits on the suppression electrode 234 and ground electrode 236, as well as the insulators 240 situated therebetween. These deposits can deleteriously effect the operation of the ion implantation system 200 by causing decomposition of the insulators 240, deposits and coating of the insulators, and in particular, uncontrollable release and discharge of these deposits and decomposed insulators, thus creating contaminating particles that are transported with the ion beam to other portions of the ion implantation system, and ultimately to the workpiece 216 being implanted.

It is noted that an exemplary system for electrode voltage modulation in an ion source extraction electrode apparatus is described in commonly-owned U.S. Pat. No. 9,006,690 to Colvin et al., and a method for reducing particle contamination in an ion implantation system is further described in commonly-owned U.S. Patent Application Publication No. 20110240889, whereby the contents of each are incorporated by reference in their entirety in the present disclosure.

The extraction electrode apparatus 218 is typically provided in an environment where there is an electrically conductive gas, where the conductive gas can make its way onto various components. Heretofore, insulating properties of the insulators 240 have deteriorated over time, as the insulator is coated with electrically conductive material from the gas. Once partially coated with conductive material, an electrical potential can make its way across an insulator surface using the gas as the conductive material. In the past, shielding of insulators 240 has been provided via cups 244 positioned around the ceramic insulator. In a gaseous environment, however, the gas will make its way to between the cups 244 and coat the surface of the insulator 240, thus leading to arcing and the aforementioned contamination.

The present disclosure, however, improves the longevity of the extraction electrode assembly 218 by providing a novel electrical insulator and method for manufacturing an insulator. More particularly, an insulator is provided and implemented in an extraction electrode apparatus 218 of an ion implantation system 100, 200, whereby coating of the insulator with conductive material is minimized.

The present disclosure advantageously provides an insulator having features which help restrict the coating of the conductive gas along the surface of the insulator. By providing one or more features such as undercuts at the ends of the insulator, the features will provide a greater lifespan of the insulator due to a longer amount of time needed for the surface thereof to become coated with conductive material.

In accordance with one example, an exemplary extraction electrode apparatus 300 provided in an exploded view FIG. 4, wherein an insulator 302 is positioned between cups 304 of the extraction electrode apparatus. The extraction electrode apparatus 300 and insulator 302 of FIG. 4, for example, may be suited for use in the ion implantation systems 100, 200 of FIGS. 1 and 2. Likewise, the insulator 302 of the present disclosure may be modified or suited to be implemented in various other semiconductor processing systems where gas conductance and arcing are problematic.

Figure 5:
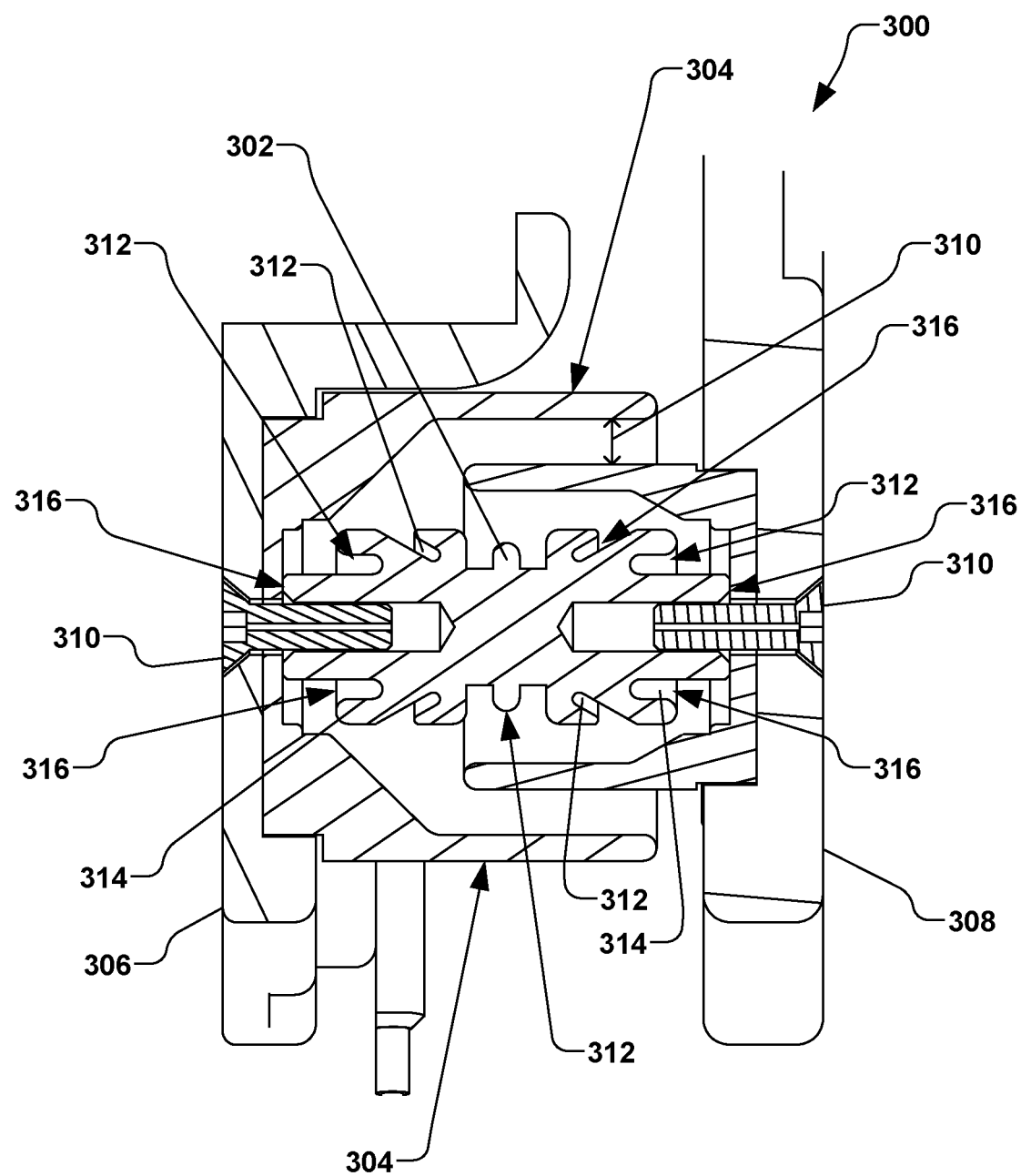
FIG. 5 is a cross-sectional view of an insulator of the present invention associated with an extraction electrode in accordance with various aspects of the present disclosure.

As illustrated in FIG. 4, the insulator 302 is formed of a ceramic material and is arranged or mounted between a suppression electrode 306 and a ground electrode 308 for electrically isolating the suppression electrode and ground electrode. The insulator 302, for example, is coupled between the suppression electrode 306 and ground electrode 308 by shoulder screws 310 threaded therein. FIG. 5 illustrates an enlarged view of the insulator 302 assembled between the suppression electrode 306 and ground electrode 308, whereby the insulator is coupled between the suppression electrode and ground electrode by shoulder screws 310 threaded into the insulator.

In accordance with the present example, the insulator 302 comprises one or more features 312 defined therein. The insulator 302 of FIG. 5, for example, is illustrated in greater detail in FIG. 6A-6C, wherein the one or more features 312, for example, are shown in cross-section 313 of FIG. 6C as comprising one or more undercuts 314 associated with one or more ends 316 of the insulator 300. The one or more undercuts 314, for example, are configured to yield a low conductance of gas flow to generally shielded regions 318 associated with the undercuts of the insulator 302. As such, a surface 320 of the insulator 302 in the generally shielded regions 318 can remain advantageously uncoated with the conductive material from the gas for a longer period of time. As such, a voltage potential is generally prevented from crossing a gap 322 associated therewith. The gap 322, for example, can be optimized via a size or geometry of the one or more undercuts 314 based, at least in part, on the expected voltage differential seen by the extraction electrode apparatus 300 of FIG. 5. The higher the expected voltage associated with the extraction electrode apparatus 300, for example, the deeper the undercut 314 in the insulator 302 of FIG. 6C can be made such that the voltage cannot arc across the gap 322.

Figure 6A:
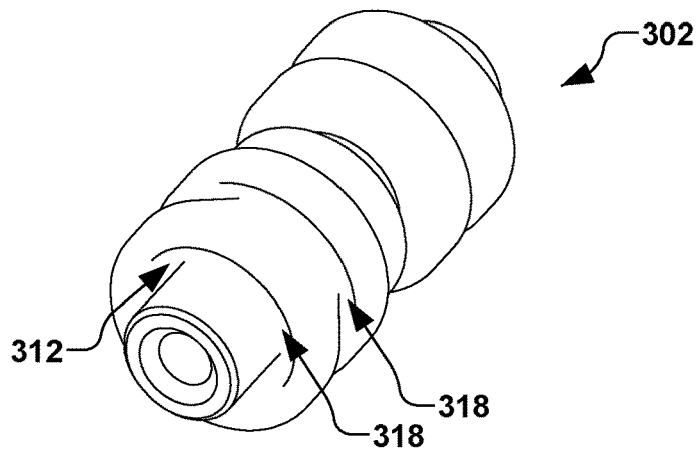
FIG. 6A is a perspective view of an insulator in accordance with an example of the present disclosure.
Figure 6B:
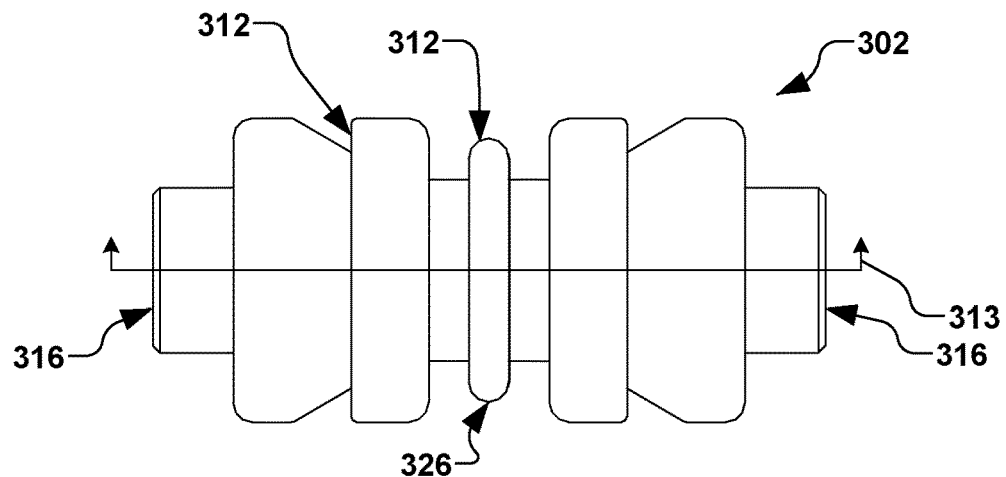
FIG. 6B is a plan view of the insulator of FIG. 6A in accordance with various aspects of the present disclosure.
Figure 6C:
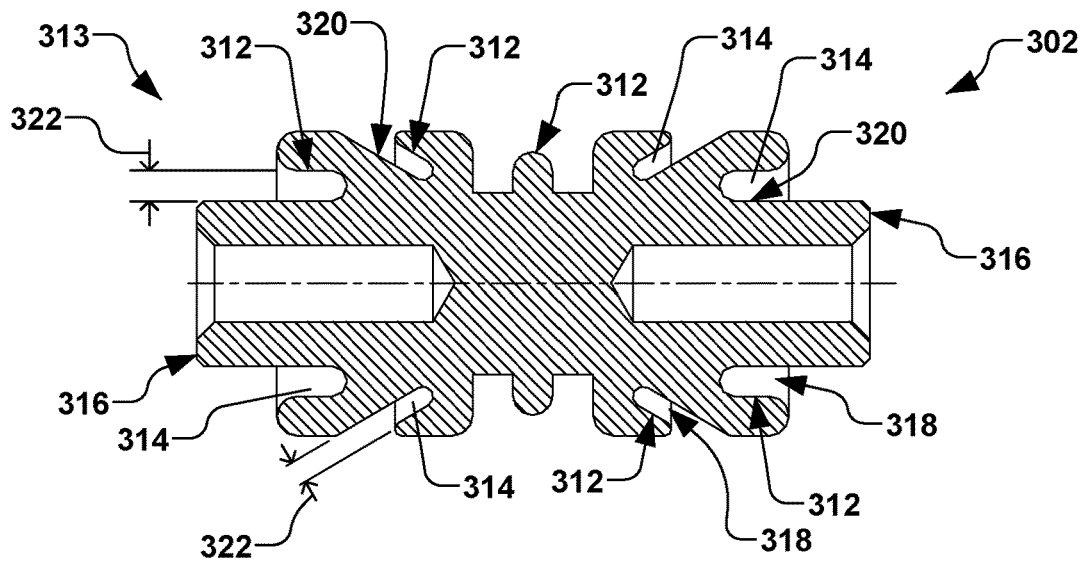
FIG. 6C is cross-sectional view of the insulator of FIGS. 6A-6B in accordance with various aspects of the present disclosure.

Compared to conventional insulators, a gas will need more time to get into the generally shielded regions 318 of the insulator 302 of FIG. 6C in order to coat the surface 320 with conductive material. Thus, the one or more undercuts 314 provide shielding as part of the insulator 302, itself. Accordingly, the insulator 302 of the present disclosure can be considered a self-shielding body. As such, gaps 324 (shown as an arrow) between the cups 304 of FIG. 5 can be made optimized for fitments, etc., whereas before, if the gaps between the cups were too large or too small, the purpose of the cups was negated due to either an excess gas conductance or arcing between the cups.

The present disclosure presently appreciates that the mode of electrical conduction is primarily from the conductive gas forming a coating over the insulator over time. If the coating is limited or reduced in certain regions, it will generally prevent arcing across the surface, thereof. Decreasing the conductance decreases the flow of gas, whereby the one or more features 312 (e.g., one or more undercuts 314, grooves, recesses, ridges, ribs) help limit the transfer of gas (e.g., decrease the conductance of the gas), and thus generally prevents fully coating the surface 320 of the insulator 302, further maintaining the insulating properties of the insulator.

The present disclosure thus provides an insulator 302 combining a limitation of the flow of the gas (ie., the conduction of gas) through the undercut generally shielded regions 318 (e.g., the one or more undercuts 314) and the lack of plating that occurs on the surface 320 of the insulator that occurs in the generally shielded regions. If the generally shielded regions 318 are not coated, the insulative properties of the insulator 302 are generally maintained. Dimensions such as the gap 322 and depth thereof can be optimized for process conditions. For example, for a greater potential, the gap 322 can be made larger in order to prevent arcing. As such, the present disclosure contemplates the gap 322 and length associated therewith as being variable based on the voltage used.

According to another example, FIGS. 6A-6C illustrate the one or more features 312 may further comprise one or more ribs 326, wherein the one or more ribs increase the area of the surface 320 of the insulator 302. For example, as the gas coats the surface 320 with electrically conductive material, the greater surface area provided by the one or more ribs 326 further provides additional area that would need to be coated to allow arcing. It is noted that the one or more ribs 326 are optional, and can be eliminated, for example, if the cups 304 are closer, where arcing could be problematic.

By providing the one or more undercuts 314 in the insulator 302 of FIG. 6C, for example, the area of the surface 320 of the insulator 302 is increases substantially. As such, the one or more undercuts 314 provide additional surface area, while further providing gas shielding. The size and shape of the one or more undercuts can advantageously limit the amount of conductive gas that flows into the generally shielded regions 318, thus limiting the plating on the insulator 302, and consequently limiting the conduction through the plating and combination of the plating and conductive gas. The difference in voltage potential gradient can lead to the gaps 322 being closer or proximate to the ends 316 of the insulator 302. The present disclosure appreciates that it is desirable to maintain the gaps 322 as tight as possible, yet large enough to prevent arcing. The present disclosure also permits use without the cups 304 of FIG. 5, as the one or more undercuts 314 can potentially decrease gas flow an adequate amount to limit arcing.

The present disclosure appreciates that one of the byproducts ion implantation is material (e.g., tungsten, molybdenum, carbon) that is free to float around. When using a fluorine gas, for example, fluorinated tungsten, fluorinated molybdenum, and fluorinated carbon gases can be created. Such materials can cause conventional insulators to be coated by approximately 80-90%. The one or more undercuts 314 advantageously mask the generally shielded regions 318, such that even if the rest of the outer surface 320 of the insulator 302 is coated, the generally shielded regions 318 (e.g., the region of the undercut) can remain uncoated. The one or more undercut 314 of the present disclosure thus advantageously increases the "tracking length", where the tracking length is the length of a gap required for a given voltage to jump or arc across or along the surface of the insulator. The one or more undercut 314 of the present disclosure advantageously increase the tracking length without increasing the length of the insulator 302. Further, since the generally shielded region 318 is generally covered, it reduces the conductance or odds of the gas to corrode or otherwise damage the insulator 302. The one or more ribs 326 or other features may be further provided to add to surface area which further increases the tracking length.

Figure 7A:
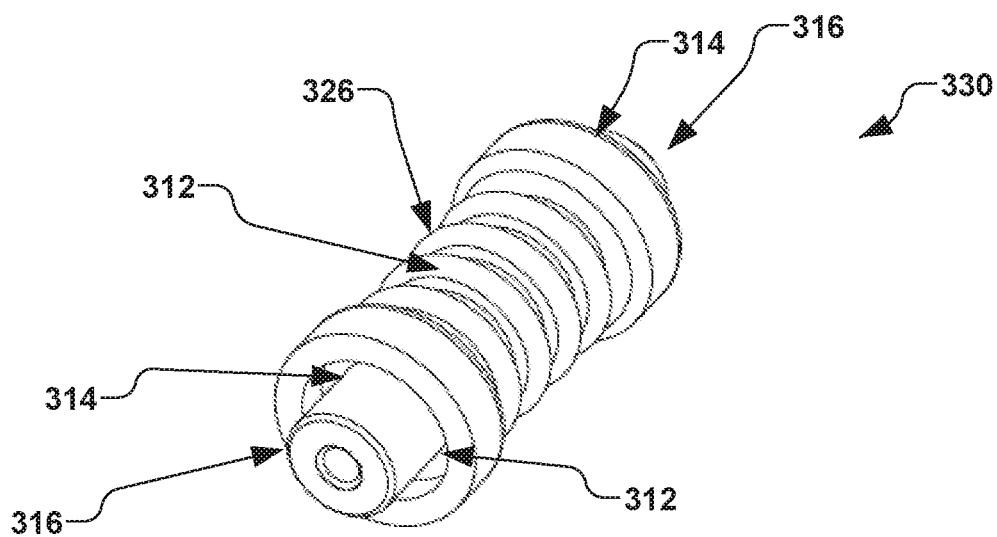
FIG. 7A is a perspective view of another insulator in accordance with an example of the present disclosure.
Figure 7B:
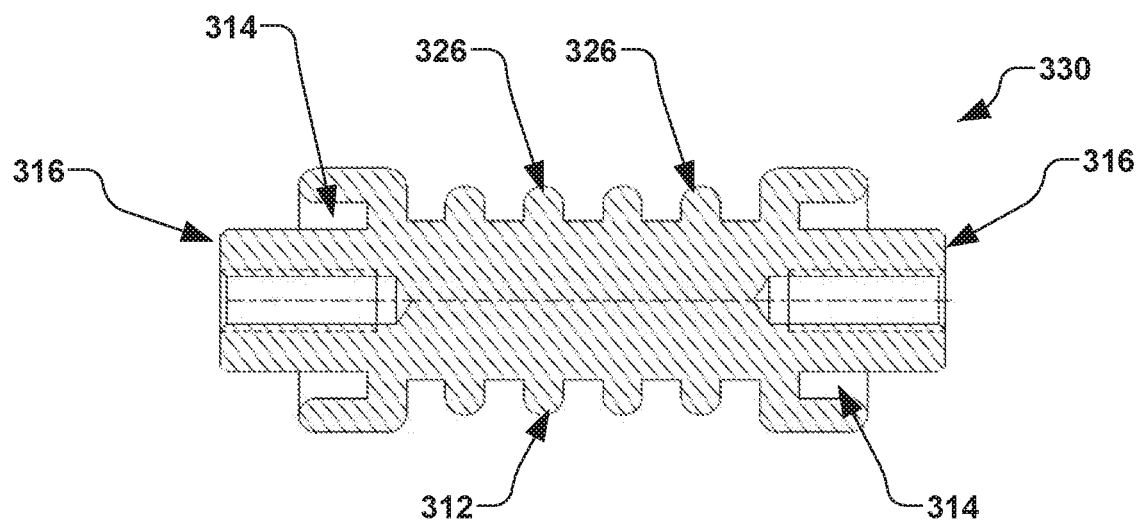
FIG. 7B is a cross-sectional view of the insulator of FIG. 7A in accordance with various aspects of the present disclosure.

The present disclosure further contemplates various configurations of the one or more features 312 of the insulator 302. For example, the insulator 302 of FIGS. 6A-6C has two undercuts 314 proximate to each end 316 thereof. As shown in the example of FIGS. 7A-7B, another insulator 330 comprises a single undercut 314 associated with each end 316. The insulator 330 may further comprise any number of ribs 326, such as shown in FIGS. 7A-7B as comprising a plurality of ribs.

Figure 8A:
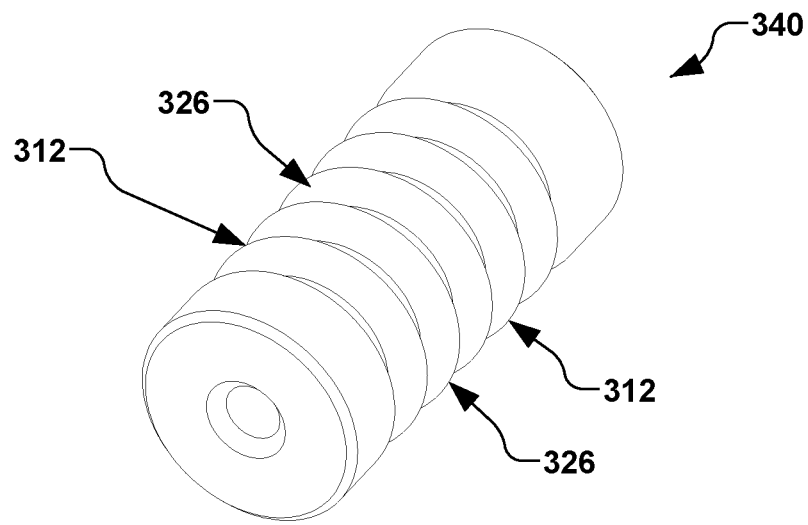
FIG. 8A is a perspective view of another insulator in accordance with an example of the present disclosure.
Figure 8B:
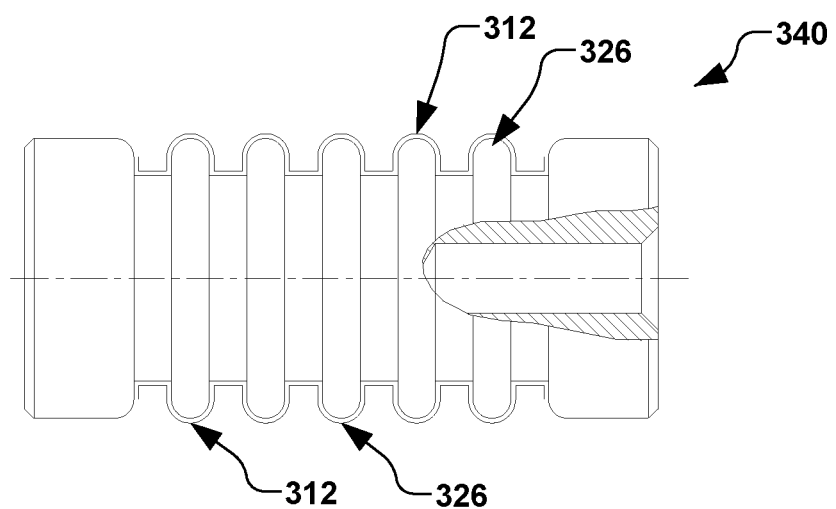
FIG. 8B is a cross-sectional view of the insulator of FIG. 8A in accordance with various aspects of the present disclosure.
Figure 9A:
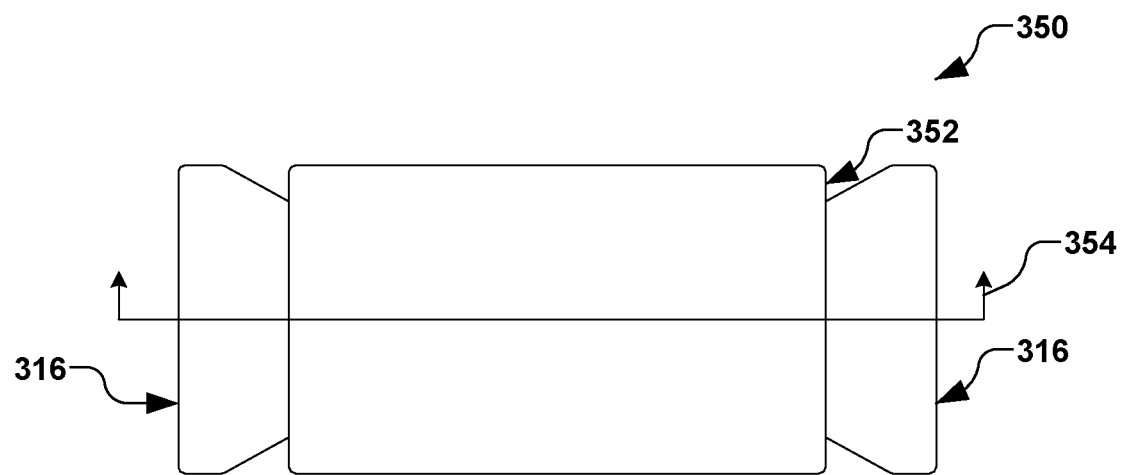
FIG. 9A is a plan view of yet another insulator in accordance with an example of the present disclosure.
Figure 9B:
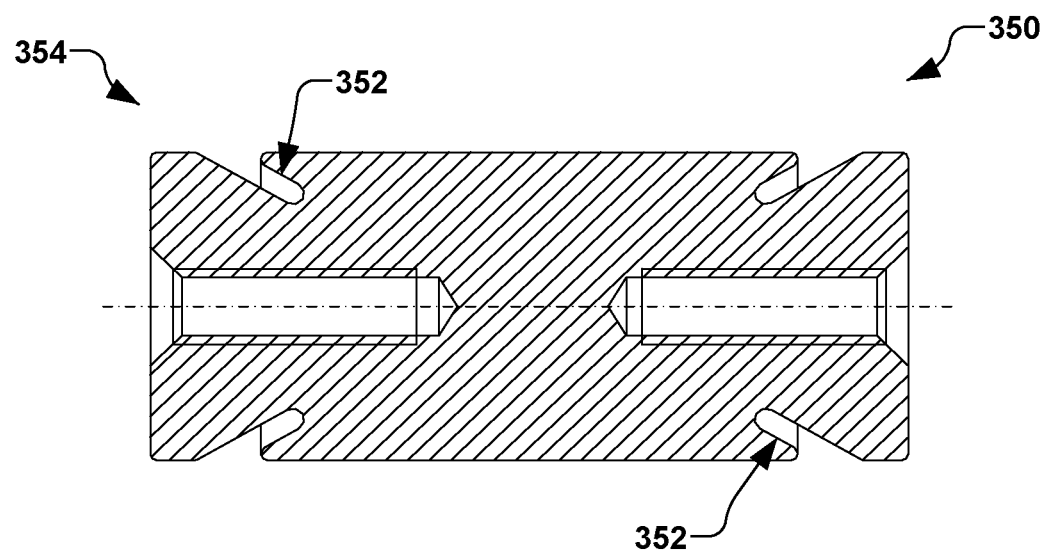
FIG. 9B is a cross-sectional view of the insulator of FIG. 9A in accordance with various aspects of the present disclosure.

FIGS. 8A-8B illustrate another insulator 340 having no undercuts, but where the one or more features 312 comprise a plurality of ribs 326. The plurality of ribs 326, for example, may be positioned or dimensioned according to various design or operational criteria associated therewith. FIGS. 9A-9B illustrate yet another exemplary insulator 350, wherein the insulator comprises a slanted or beveled undercut 352 associated with one or more of the ends 316 of the insulator, as illustrated in the cross-section 354 of FIG. 9B. As such, it will be further appreciated that the one or more undercuts 352 can also be provided in the middle region (between the ends 316) of the insulator via grooves (not shown) at an angle with respect to an axis 356 of the insulator.

The present disclosure further provides an insulator that can molded directly into a desired shape and subsequently fired or cured. For example, the insulator is comprised of a ceramic, aluminum oxide, boron nitride, or any insulator material suitable for use in a system such as an ion implantation system.

In accordance with another exemplary aspect of the invention, a method for manufacturing an insulator comprising an undercut is provided. The present disclosure appreciates that features that are made after firing or curing of the insulator can be difficult and typically requires special tooling (e.g., diamond tipped bits, etc.), slower tooling speed, etc. As such, a high reject rate from chipping, etc. can be seen when forming features post-firing. The present disclosure thus provides an undercut in the insulator prior to firing, whereby the undercut is defined by forming or cutting via a hole saw or the like while the insulative material is still ductile or "green", and wherein the insulator is subsequently fired or cured after the undercut is defined. For example, a body of the insulator can be cast to overall dimensions, and then undercut can be defined via a hole saw or other tool, and subsequently fired or cured. Such a methodology advantageously decreases manufacturing costs associated with hardened tooling and/or breakage of product.

Figure 10:
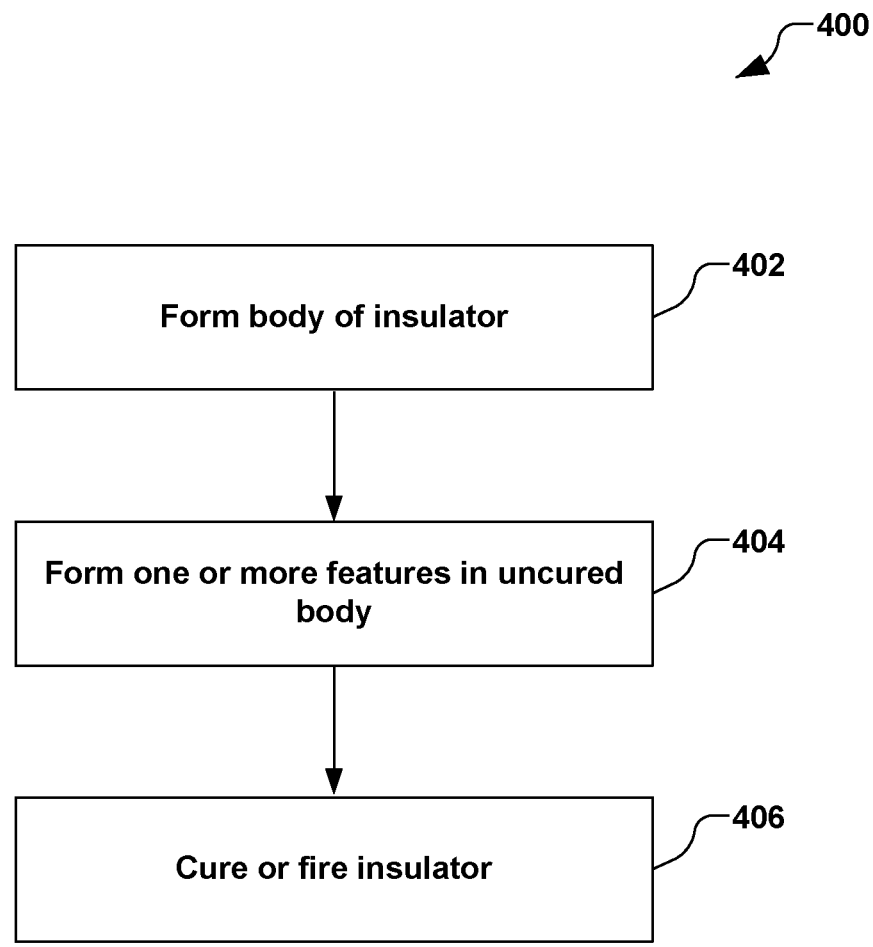
FIG. 10 illustrates a methodology for forming an insulator, in accordance with still another aspect of the present disclosure.

Accordingly, as illustrated in FIG. 10, the present disclosure further provides a method 400 for forming an insulator in accordance with the present invention. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 11, the method 400 begins with forming the body of the insulator in act 402, such as by casting the body from aluminum oxide, boron nitride, or any insulator material. Once the body is generally formed in act 402, one or more features such as the undercut described above are formed in act 404. The formation of the one or more features, for example, are formed in act 404 via a hole saw or other tool. After the one or more features are formed in act 404, the insulator is fired or cured in act 406, thus hardening the insulator and providing final insulative properties thereto. Sizing of the one or more features, for example, can be determined such that a predetermined shrinkage during curing or firing yields a predetermined final dimension.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An insulator, comprising an elongate body having a first end and a second end, wherein the elongate body has one or more features defined therein, and wherein the one or more features increase a gas conductance path from the first end to the second end.

2. The insulator of claim 1, wherein one or more of the one or more features comprises an undercut extending generally axially into the elongate body.

3. The insulator of claim 2, wherein the undercut extends from a position proximate to one or more of the first end and the second end toward the opposite of the respective first end and the second end.

4. The insulator of claim 2, wherein the undercut is generally U-shaped.

5. The insulator of claim 1, wherein one or more of the one or more features comprises an undercut extending generally radially into the elongate body.

6. The insulator of claim 5, wherein the undercut extends from a position proximate to one or more of the first end and the second end toward the opposite of the respective first end and the second end.

7. The insulator of claim 5, wherein the undercut is generally U-shaped.

8. The insulator of claim 1, wherein one or more of the one or more features comprises an undercut extending into the elongate body at a non-zero angle from an axis of the elongate body.

9. The insulator of claim 8, wherein the undercut extends from a position proximate to one or more of the first end and the second end toward the opposite of the respective first end and the second end.

10. The insulator of claim 1, wherein the undercut provides an increased gas conductance path from the first end to the second end along a surface of the elongate body.

11. The insulator of claim 1, wherein one or more of the one or more features comprise a rib extending from a radius of the elongate body.

12. The insulator of claim 11, wherein one or more of the one or more features comprises an undercut extending into the elongate body at an acute angle from an axis of the elongate body, and wherein the undercut extends from a position proximate to one or more of the first end and the second end toward the opposite of the respective first end and the second end both the first end and second end each comprise an undercut.

13. The insulator of claim 1, wherein the elongate body comprises a surface that is electrically insulative.

14. The insulator of claim 1, wherein the elongate body is comprised of an electrically insulative material.

15. An ion source, comprising:
    an apertured ground electrode;
    an apertured suppression electrode; and
    an insulator positioned between the apertured ground electrode and apertured suppression electrode, wherein the insulator comprises an elongate body having a first end and a second end, wherein the elongate body has one or more features defined therein, and wherein the one or more features increase a gas conductance path along a surface of the elongate body from the first end to the second end.

16. The ion source of claim 15, wherein one or more of the one or more features comprises an undercut extending generally axially into the elongate body.

17. The ion source of claim 15, wherein one or more of the one or more features comprises an undercut extending into the elongate body at a non-zero angle from an axis of the elongate body.

18. The ion source of claim 17, wherein the undercut extends from a position proximate to one or more of the first end and the second end toward the opposite of the respective first end and the second end.

19. The ion source of claim 17, wherein one or more of the one or more features comprise a rib extending from a radius of the elongate body.

20. A method of forming an insulator, comprising:
    forming a body of the insulator out of insulative material;
    forming one or more features in the body after the body is formed; and
    curing the body once the one or more features are formed.

* * * * *